United States Patent
Chan et al.

[19]

[11] Patent Number: 5,863,868
[45] Date of Patent: Jan. 26, 1999

[54] SUPERCONDUCTIVE QUANTUM INTERFERENCE DEVICE FOR DIGITAL LOGIC CIRCUITS

[75] Inventors: Hugo Wai-Kung Chan; Kenneth P. Daly, both of Rancho Palos Verdes; James M. Murduck, Redondo Beach, all of Calif.

[73] Assignee: TRW Inc., Redondo Beach, Calif.

[21] Appl. No.: 937,372

[22] Filed: Sep. 25, 1997

Related U.S. Application Data

[63] Continuation of Ser. No. 628,074, Apr. 8, 1996, abandoned.

[51] Int. Cl.[6] .......................... G01B 39/00; H01L 29/06; H01L 39/22; G01P 39/00
[52] U.S. Cl. ......................... 505/162; 257/31; 257/33; 257/34; 324/248; 505/190; 505/234; 505/238
[58] Field of Search ................. 257/31–35; 505/162, 505/190, 234, 238, 329; 324/248

[56] References Cited

U.S. PATENT DOCUMENTS

| | | | |
|---|---|---|---|
| 3,564,351 | 2/1971 | McCumber | 317/234 |
| 4,224,630 | 9/1980 | Kroger | 357/5 |
| 4,403,189 | 9/1983 | Simmonds | 324/248 |
| 4,430,662 | 2/1984 | Jillie, Jr. et al. | 357/5 |
| 4,430,790 | 2/1984 | Ohta | 29/569 R |
| 4,498,228 | 2/1985 | Jillie, Jr. et al. | 29/577 C |
| 4,525,730 | 6/1985 | Beha et al. | 357/5 |
| 4,554,567 | 11/1985 | Jillie et al. | 357/5 |
| 4,563,695 | 1/1986 | Tarutani et al. | 357/5 |
| 4,751,563 | 6/1988 | Laibowitz et al. | 357/71 |
| 4,843,446 | 6/1989 | Nishino et al. | 357/30 |
| 4,954,480 | 9/1990 | Imanaka et al. | 505/1 |
| 5,087,605 | 2/1992 | Hegde et al. | 505/190 |
| 5,173,660 | 12/1992 | Marsden | 324/248 |
| 5,183,799 | 2/1993 | Ogushi et al. | 505/110 |
| 5,218,297 | 6/1993 | Nakane et al. | 324/248 |
| 5,256,636 | 10/1993 | Wellstood et al. | 505/190 |
| 5,280,241 | 1/1994 | Ueda et al. | 324/248 |
| 5,304,817 | 4/1994 | Ishida | 257/31 |

FOREIGN PATENT DOCUMENTS

| | | | |
|---|---|---|---|
| 1-6779 | 1/1989 | Japan | 324/248 |
| 1-241874 | 9/1989 | Japan . | |
| 3-297178 | 12/1991 | Japan . | |
| 4-32275 | 2/1992 | Japan . | |
| 4-233286 | 8/1992 | Japan . | |

*Primary Examiner*—Mahshid D. Saadat
*Assistant Examiner*—Allan R. Wilson
*Attorney, Agent, or Firm*—Michael S. Yatsko

[57] ABSTRACT

A SQUID 10 was multiple junctions, each junction allowing a critical current to flow therethrough. The SQUID 10 comprises a laminar structure including: (a) a substantially planar substrate 12; (b) a first high temperature superconductive layer 14 of substantially uniform thickness deposited on the substrates; (c) a dielectric layer 16 deposited on the first superconductive layer 14, the dielectric layer 16 comprising a planar level segment 18 having two ramp segments defining SQUID junctions at opposing ends 20 and defining SQUID hole; and (d) a second high temperature superconductive layer 24 of substantially uniform thickness deposited on the dielectric layer 16, the second high temperature superconductive layer 24 covering all three segments of the dielectric layer 16. A magnetic field substantially parallel to the substrate applied to the SQUID hole modulates a critical current flowing through the junctions while minimizing magnetic field penetration into the junctions and minimizing SQUID loop inductance.

7 Claims, 8 Drawing Sheets

SUPERCONDUCTIVE QUANTUM INTERFERENCE DEVICE FOR DIGITAL LOGIC CIRCUITS

This application is a continuation of U.S. patent application Ser. No. 08/628,074, filed Apr. 8, 1996 now abandoned.

BACKGROUND

The present invention generally relates to Superconductive Quantum Interference Devices (SQUID), and in particular to SQUIDs for digital logic circuits.

With the steady demand for faster and more efficient communication and processing systems, many manufacturers are utilizing SQUIDs as digital circuit components in processing and communication systems. Generally, a SQUID is a two-terminal superconductive junction device capable of carrying a critical current through the junction. Critical current is defined as the maximum amount of current which the SQUID can carry with no voltage. The amount of current flowing through the SQUID can be modulated by a magnetic field threading the SQUID. The more intense the magnetic field, the lower the amount of critical current that can flow through the SQUID. Typically the magnetic field is generated by an inductor such as a control line carrying a control current. The intensity of the magnetic field can be controlled by the magnitude of the control current flowing through the control line.

Existing SQUIDs used in digital circuits have several important disadvantages however. Because critical current flow in a SQUID depends on the strength of the magnetic field applied to the SQUID, the sensitivity of the SQUID to the magnetic field, $\beta_L$, is of paramount importance. A low $\beta_L$ generally indicates a more sensitive SQUID which is more responsive to variations in the magnetic field. For example, for a SQUID with a $\beta_L$ of 1 or less, a critical current of about 1 milliamp flowing through the SQUID can be modulated to about 0.1 milliamp by changing the intensity of the magnetic field applied to the SQUID. By contrast, for a SQUID with a $\beta_L$ of about 100, the critical current can only be reduced from 1 milliamp to 0.9 milliamp, regardless of the amount of change in the magnetic field applied to the SQUID. Therefore, a SQUID with a high $\beta_L$ is disadvantageous because of the limited critical current modulation possible.

Another disadvantage of existing SQUIDs is lack of uniformity of the SQUID step-edge junction characteristics, resulting in substantial variation in the amount of current flowing through the SQUID at different points across the SQUID junction. This is because in a step edge junction, the edges of the junction are unprotected. The exposed edges suffer from ion-damage during milling patterning processes, and are susceptible to contamination and damage from further processing by exposure to solvent and etchant chemicals. As such, the critical current density at the edges of the junction is nonuniform as compared to the rest of the junction. Typically, the best result for junction critical current uniformity for a 2 micron step-edge SQUID is about 20–30% 1 sigma.

Yet another disadvantage of existing SQUIDs is lack of linearity and uniformity of the SQUID critical current subjected to analog control signals via the SQUID control line. This makes existing SQUIDs particularly unsuitable for use in high-resolution analog-to-digital converters (ADC), for example. The quantizer in an ADC calibrates the input analog signal into discrete digital signal levels. In high-resolution ADCs, the input analog signal can be high in magnitude. For example, for a 10-bit ADC, if the equivalent least significant bit analog current is 10 microamps, then the most significant bit analog current is 10 milliamps. The lack of uniformity in linearity and critical current in existing SQUIDs substantially reduces the operation margin of ADC quantizers, making them unsuitable for proper handling of large current variations in input analog signals exemplared above.

There is therefore a need for a SQUID with a low $\beta_L$ for critical current modulation. There is also a need for a SQUID with uniform current density flowing across the SQUID junctions. There is also a need for a SQUID with linear and uniform critical current flow when subjected to analog control signals via the SQUID control line.

SUMMARY

The present invention satisfies these needs. The present invention provides a SQUID with multiple junctions, each junction allowing a critical current to flow therethrough. The SQUID comprises a laminar structure including: (a) a substantially planar substrate; (b) a first high temperature superconductive layer of substantially uniform thickness deposited on the substrate; (c) a dielectric layer deposited on the first superconductive layer, the dielectric layer comprising a planar level segment having opposing ends, and two planar ramp segments, the ramp segments being connected to the level segment at the opposing ends of the level segment and at opposite angles thereto; and (d) a second high temperature superconductive layer of substantially uniform thickness deposited on the dielectric layer, the second high temperature superconductive layer covering all three segments of the dielectric layer.

The SQUID has multiple junctions, each junction being formed at a ramp segment of the dielectric layer. The dielectric layer sandwiched between the first and the second superconductive layers defines a SQUID hole substantially perpendicular to the plane of the substrate. A magnetic field applied to the SQUID hole substantially parallel to the plane of the substrate and substantially parallel to the plane of the ramp segments provides for modulation of a critical current flowing through the junctions while minimizing magnetic field penetration into the junctions and minimizing SQUID loop inductance.

Preferably, each junction has a width of at least about 0.1 microns and, more preferably, the width of each junction is about 0.1 microns to about 10 microns. The SQUID can further comprise an inductor disposed proximate the laminar structure, wherein a magnetic field generated by the inductor by a control current flowing through the inductor is substantially parallel to the plane of the substrate and substantially parallel to the plane of the ramp segments.

Since magnetic filed coupling to the SQUID is perpendicular to the SQUID hole but parallel to the ramp segments, advantageously, there is maximum magnetic filed coupling to the SQUID hole and minimum magnetic filed coupling to the SQUID junctions. As such, the SQUID has uniform and linear critical current modulation characteristics.

The SQUID can further comprise a first passivation layer deposited on the first superconductive layer, wherein the dielectric layer is deposited on the passivation layer. The SQUID can further comprise a second passivation layer deposited on the second superconductive layer.

In another embodiment, the present invention provides a SQUID with multiple junctions, the SQUID comprising a laminar structure including: (a) a substantially planar substrate; (b) a first high temperature superconductive layer deposited on the substrate; (c) a dielectric layer of substantially uniform thickness deposited on the first superconductive layer, the dielectric layer having at least two holes therethrough to expose portions of the first superconductive layer, each hole having walls meeting the first superconductive layer at acute angles; and (d) a second high temperature superconductive layer of substantially uniform thickness deposited on the dielectric layer, the second superconductive layer covering the walls of the holes and covering the portions of the first superconductive layer exposed through the holes in the dielectric layer.

The SQUID has multiple junctions, each junction being formed at the walls of each hole in the dielectric layer. The dielectric layer between a pair of holes defines a SQUID hole substantially perpendicular to the plane of the substrate. A magnetic field applied to the SQUID hole substantially parallel to the plane of the substrate provides for modulation of a critical current flowing through the junctions while minimizing SQUID loop inductance.

Because the holes in the dielectric layer are encapsulated between the first and the second superconductive layers, the edges of the SQUID junctions are protected from processing damage, resulting in uniform current density at the edges of the junctions compared to the other areas of the junctions.

Preferably, each junction has a width of at least about 0.1 microns, and more preferably the width of each junction is about 0.1 microns to about 10 microns. The SQUID can further comprise an inductor disposed proximate the laminar structure, wherein a magnetic field generated by the inductor by a control current flowing through the inductor is substantially parallel to the plane of the substrate.

DRAWINGS

These and other features, aspects and advantages of the present invention will become understood with reference to the following description, appended claims and accompanying drawings where:

DESCRIPTION

Figure 1:
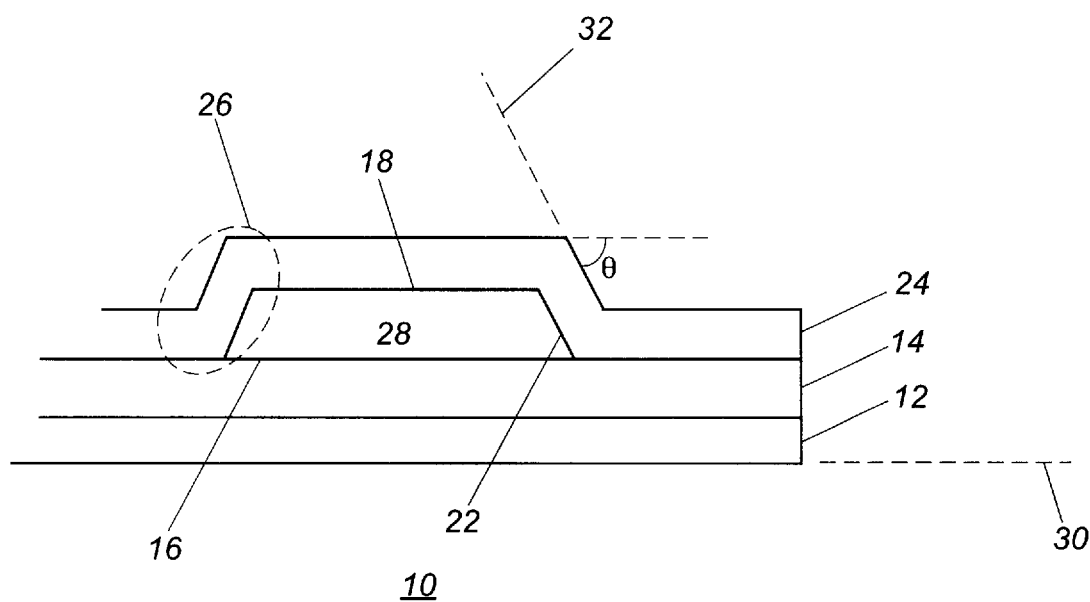
FIG. 1 illustrates a side cross-sectional view of a laminar structure of a SQUID according to the present invention.
Figure 2:
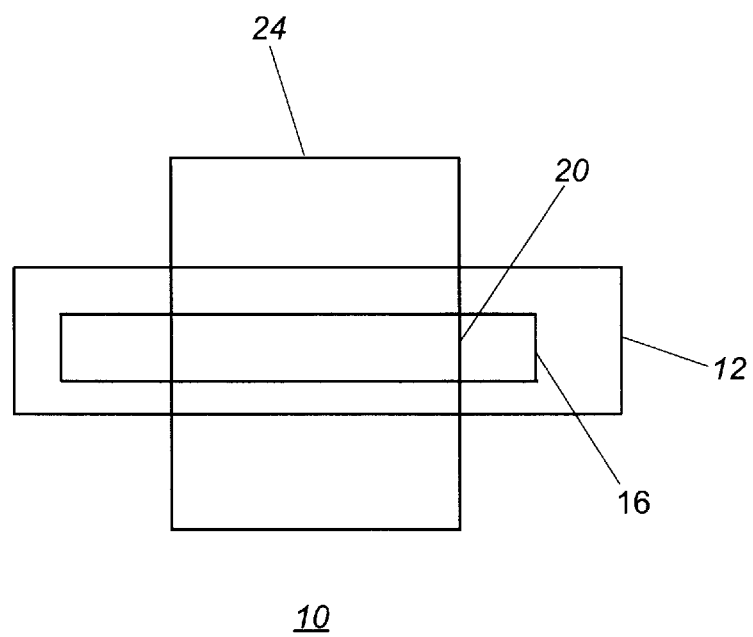
FIG. 2 illustrates a top view of the laminar structure of FIG. 1.

Referring to FIGS. 1–2, an embodiment of a SQUID according to the present invention is described. The present invention provides a SQUID 10 with multiple junctions, wherein the SQUID comprises a laminar structure including: (a) a substantially planar substrate 12; (b) a first high temperature superconductive layer 14 of substantially uniform thickness deposited on the substrate 12; (c) a dielectric layer 16 deposited on the first superconductive layer 14, the dielectric layer 16 comprising a planar level segment 18 having opposing ends 20, and two planar ramp segments 22, the ramp segments 22 being connected to the level segment 18 at the opposing ends 20 of the level segment 18 and at opposite angles thereto; and (d) a second high temperature superconductive layer 24 of substantially uniform thickness deposited on the dielectric layer 16, the second high temperature superconductive layer 24 covering all three segments of the dielectric layer 16.

The SQUID 10 has multiple junctions 26, each junction 26 being formed at a ramp segment 22 of the dielectric layer 16. Although in the embodiment of the invention shown in FIGS. 1–2 the SQUID 10 has two junctions 26, practitioners in the art recognize that additional junctions can be implemented using multiple laminar structures, each including the superconductor-dielectric-superconductor laminar structure described above, on the same substrate.

The dielectric layer 16 sandwiched between the first and the second superconductive layers 14 and 24, respectively, defines a SQUID hole 28 substantially perpendicular to the plane 30 of the substrate 12. A magnetic field applied to the SQUID hole 28 substantially parallel to the plane 30 of the substrate and substantially parallel to the plane 32 of the ramp segments 22, advantageously, provides for modulation of a critical current flowing through the junctions 26 while minimizing magnetic field penetration into the junctions 26 and minimizing SQUID loop inductance.

Because the ramp segments 22 present minimal profile to the magnetic field, magnetic field penetration to the SQUID junctions 26 is minimal, resulting in a low $\beta_L$ with excellent sensitivity to magnetic field flux, and increased critical current modulation with applied control current.

Figure 3:
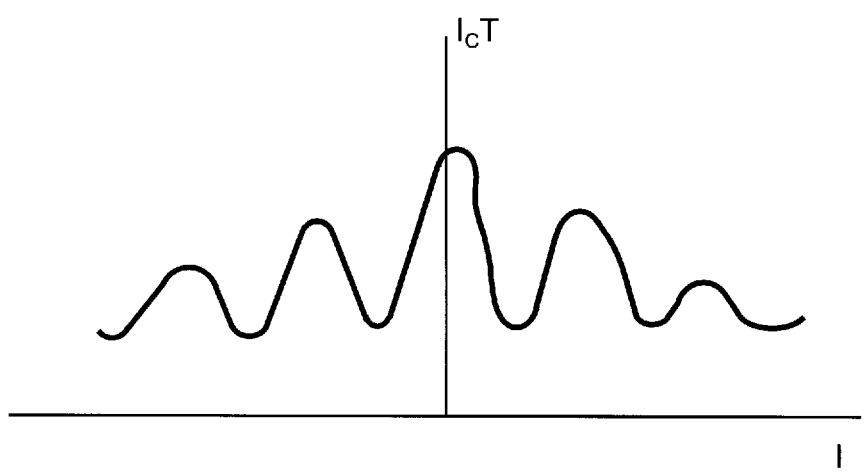
FIG. 3 illustrates a graph of the non-uniform critical current modulation characteristics of prior art SQUIDS.

Minimizing SQUID sensitivity to magnetic field penetration of the junctions also results in desirable critical current (IcT) vs control current (I) relationship. FIG. 3 illustrates the lack of uniformity in critical current vs control current relationship in existing SQUIDS. Magnetic field penetration into the junctions 26 complicates the phase coupling relationship of the superconductive pair across the junction giving rise to the modulated critical current peak change as a function of control current.

As explained above, such lack of uniformity of the SQUID critical current subjected to a control current makes existing SQUIDs particularly unsuitable for use in high-resolution analog-to-digital converters (ADC), for example.

Figure 4:
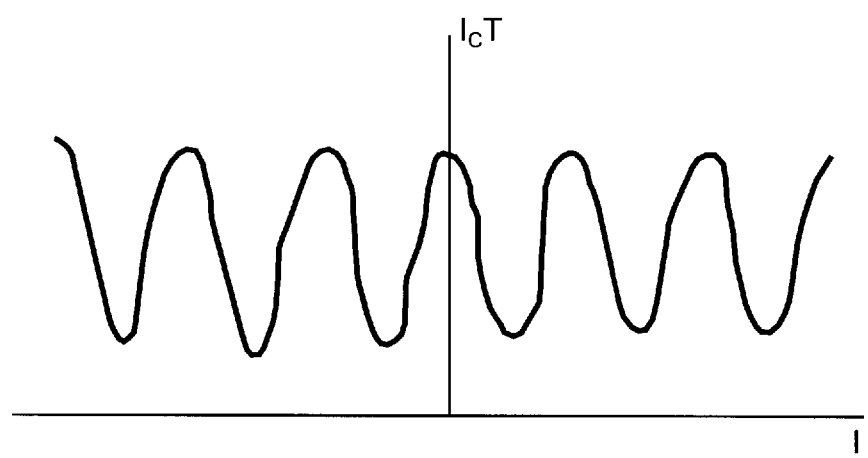
FIG. 4 illustrates a graph of uniform and periodic critical current modulation characteristics of the SQUID of FIG. 1.

By minimizing SQUID sensitivity to magnetic field penetration of the junctions, the present invention, advantageously, provides a SQUID with the uniform and linear critical current vs control current relationship illustrated in FIG. 4. As such, the dynamic range of the SQUID 10 is expanded from about 2–4 bits to about 8–20 bits, permitting use of the SQUID 10 of the present invention in high frequency applications such a high resolution ADCs. This is because for such applications, uniform periodicity of the critical current vs control current shown in FIG. 4 is particularly desirable.

Because the SQUID hole 28 is perpendicular to the plane 30 of the substrate 12, the SQUID of the present invention has significantly lower SQUID loop inductance.

The dielectric layer 16 is selected from the group consisting essentially of perovskite structures. Preferably, the perovskite structures have a lattice structure which substantially match the lattice structure of a high critical temperature ($T_c$) film, such as high $T_c$ copper-oxide superconductors, to enable epitaxial growth on the dielectric layer 16. Example perovskite structures suitable for use as the dielectric layer include $SrTiO_3$ and $LaAlO_3$. Preferably, the level segment 18 of the dielectric layer 16 is about 1000 A to about 3000 A in thickness.

The first and the second superconductive layers 14 and 24, respectively, are selected from the group consisting essentially of copper-oxide superconductors. Example of suitable materials for the first and the second superconductive layers 14 and 24 include $YBa_2Cu_3O_7$ (YBCO). Preferably, the first and the second superconductive layers 14 and 24 are each about 1000 A to about 3000 A in thickness.

The SQUID 10 can further comprise a first passivation layer deposited on the first superconductive layer 14, wherein the dielectric layer 16 is deposited on the passivation layer. Preferably, the first passivation layer is a dielectric selected from the group consisting essentially of perovskite structures described above. The first passivation layer can be about 200 to about 2000 A in thickness.

The SQUID 10 can further comprise a second passivation layer deposited on the second Superconductive layer 24. Preferably, the second passivation layer is a dielectric selected from the group consisting essentially of perovskite structures described above. The second passivation layer can be about 200 to about 2000 A in thickness.

Figure 5:
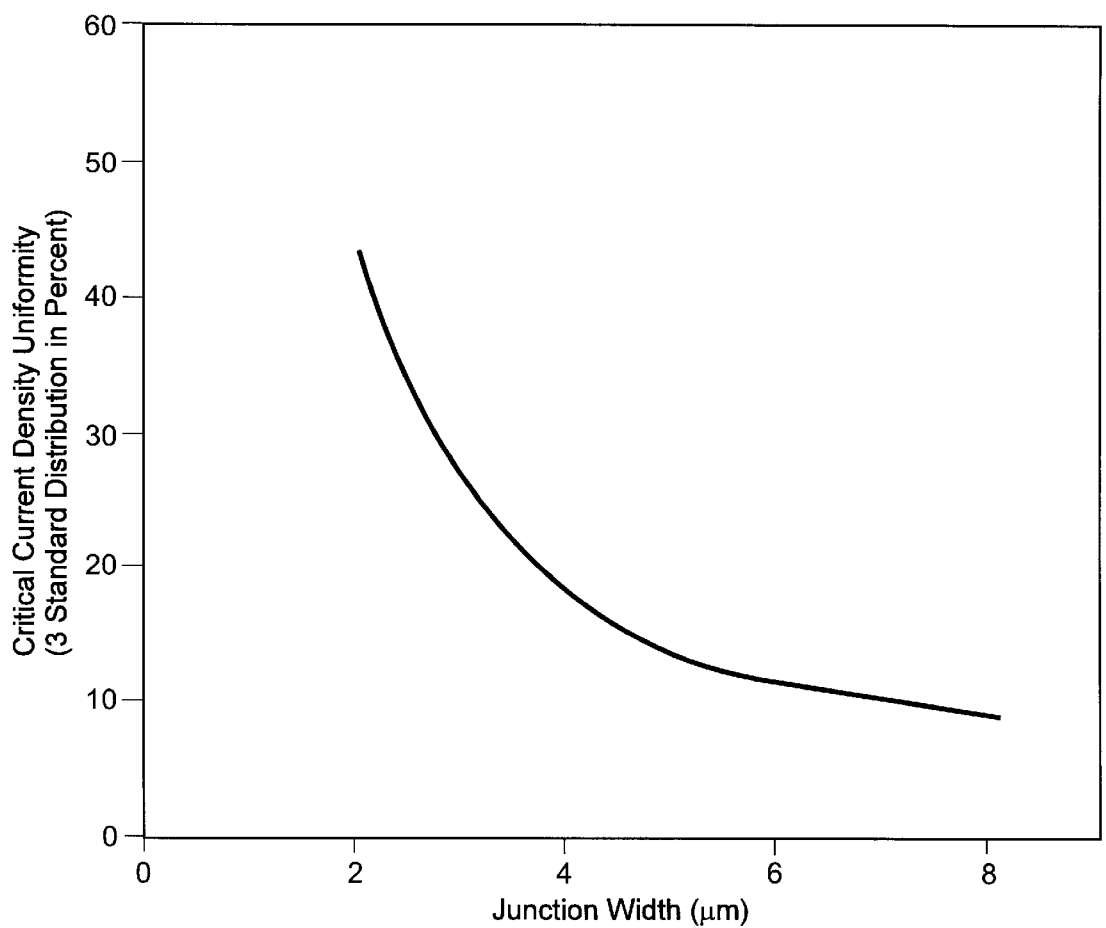
FIG. 5 illustrates the critical current spread for Josephson junctions of various widths.

The width of the dielectric layer 16 can be selected to be about 0.1 to about 10 microns, and preferably about 3 to 4 microns. A wider junction has lower percentage sigma. This achieves uniformity in SQUID junction characteristics, resulting in minimal variation in the amount of current flowing through the SQUID at different points across the SQUID junction. In existing SQUIDs, typically, the best result for junction critical current uniformity for a 2 micron step-edge SQUID is about 20–30% 1 sigma. This is because critical current density at the edges of the junction are non-uniform as compared to the rest of the junction. The non-uniformity is percentage wise more significant for a narrow junction as compared to a wider junction, and in large part accounts for the critical current uniformity vs junction width illustrated in FIG. 5. The junction structure of the present invention allows for wider junctions. Critical current increases with width and decreases with inductance. Therefore, $\beta_L$ is proportional to inductance.

The ramp segments 22 of the dielectric layer 16 descend from the level segment 18 at an angle $\theta$ of about 30 degrees to about 90 degrees, and preferably at about 60 degrees. The ramp segments 22 can also have different descent angles $\theta$.

Figure 6:
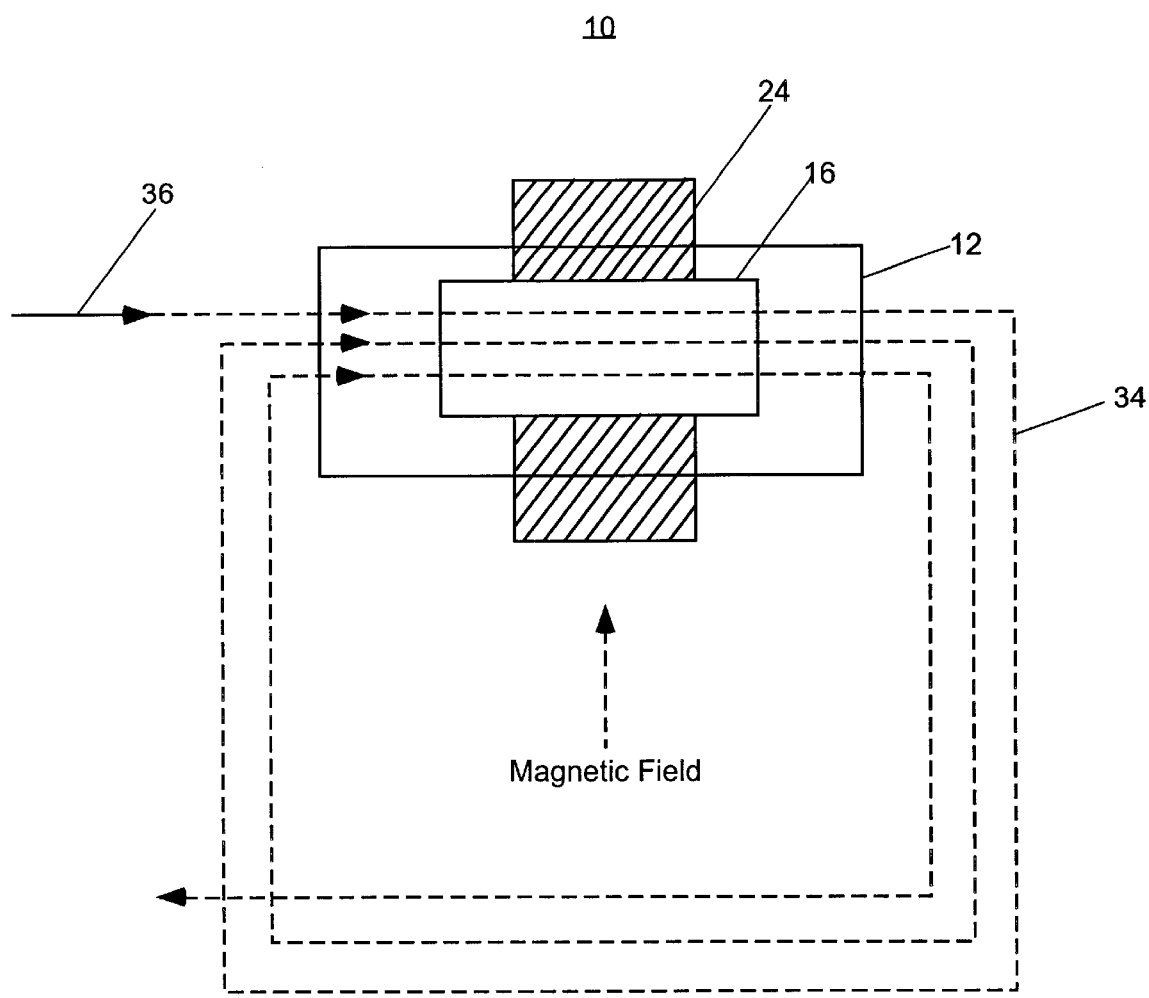
FIG. 6 illustrates an inductor disposed proximate the laminar structure of FIG. 1.

Referring to FIG. 6, the SQUID 10 can further comprise an inductor 34 disposed proximate the laminar structure to generate a magnetic field substantially parallel to the plane 30 of the substrate 12 and substantially parallel to the plane 32 of the ramp segments 22. The strength of the magnetic field is proportional to the magnitude of a control current (I) flowing to the inductor 34.

Preferably the inductor 34 comprises a control line 36 disposed proximate the laminar structure of the SQUID 10 as described above. The control line 36 can comprise a third superconductive layer separated from the second superconductive layer 24 by an insulative layer. A pair of electrodes can be utilized to apply a control current to the third superconductive layer, whereby the flow of control current in the third superconductive layer generates a magnetic field.

Alternatively, the control line 36 is an in-line control line implemented by applying the control current to the first or the second superconductive layers 14 or 24 to generate the desired magnetic field.

An example method of fabricating the SQUID 10 of the present invention is now described. Deposit and pattern a first superconductive layer via ion-milling or RIE over a substrate. A first passivation layer of dielectric can be deposited in situ over the first superconductive layer. Deposit and pattern via ion-milling or RIE a stepped dielectric layer described above over the first superconductive layer. Deposit and pattern a second superconductive layer over the dielectric layer. A thin passivation layer of dielectric can be deposited in situ on the second superconductive layer. Step-edge junctions are formed where the first superconductive layer crosses-over the steps in the dielectric layer to meet the first superconductive layer. Practitioners in the art recognize that other methods of fabricating the SQUID are equally appropriate.

Figure 7:
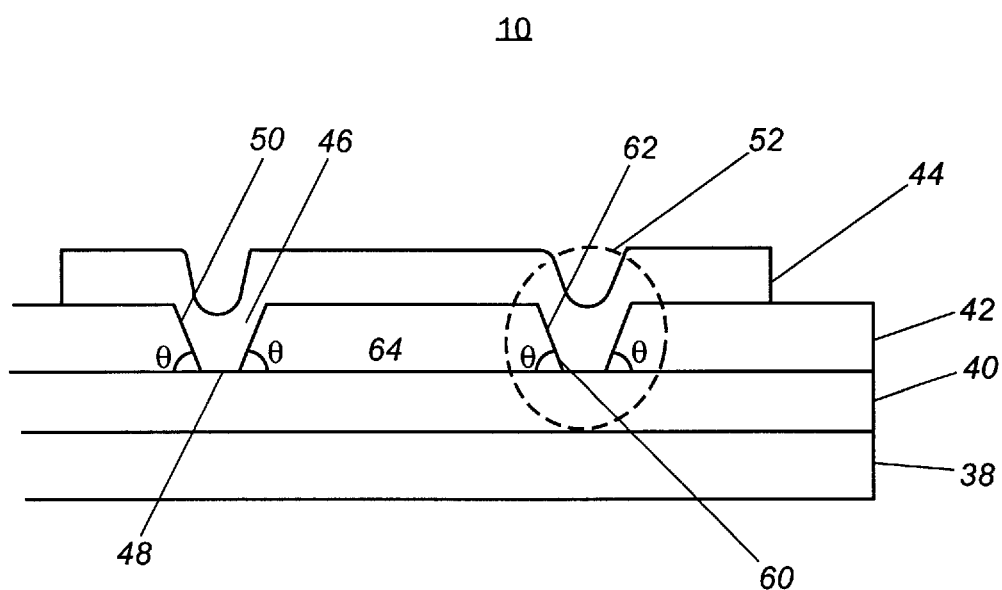
FIG. 7 illustrates a side cross-sectional view of a laminar structure of a SQUID according to another aspect of the present invention.
Figure 8:
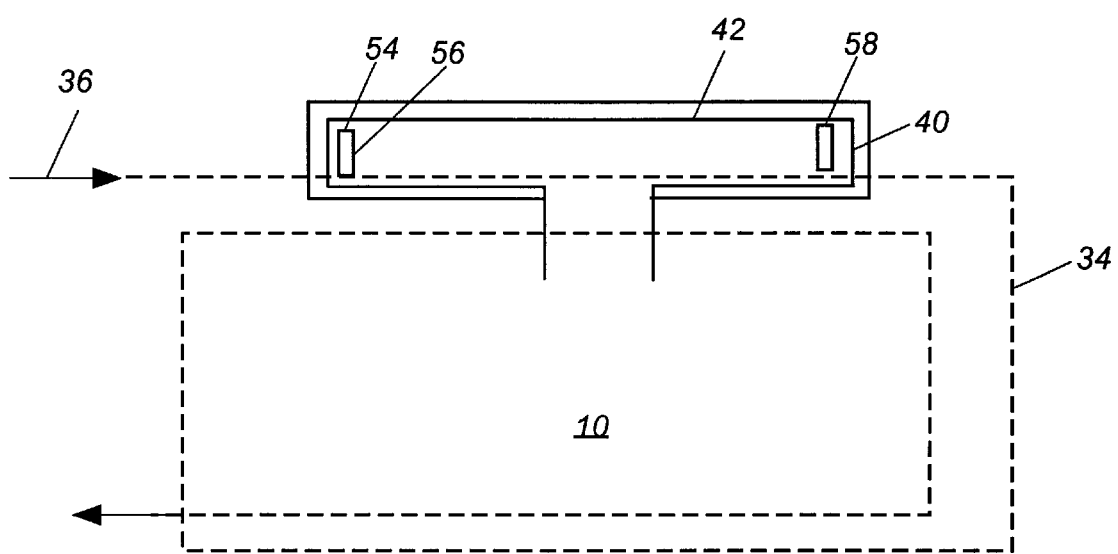
FIG. 8 illustrates a top view of the laminar structure of FIG. 7.

Referring to FIGS. 7–8, in another embodiment, the present invention provides a SQUID 10 with multiple junctions, the SQUID 10 comprising a laminar structure including: (a) a substantially planar substrate 38; (b) a first high temperature superconductive layer 40 deposited on the substrate 38; (c) a dielectric layer 42 of substantially uniform thickness deposited on the first superconductive layer 40, the dielectric layer 42 having at least two holes 46 therethrough to expose portions 48 of the first superconductive layer 40, each hole 46 having walls 50 meeting the first superconductive layer 40 at acute angles $\theta$; and (d) a second high temperature superconductive layer 44 of substantially uniform thickness deposited on the dielectric layer 42, the second superconductive layer 44 covering the walls 50 of the holes 46 and covering the portions 48 of the first superconductive layer 40 exposed through the holes 46 in the dielectric layer 42.

The SQUID 10 has multiple junctions 52, with each junction 52 being formed at the walls 50 of each hole 46 in the dielectric layer 42. The junctions 52 are substantially sealed between the first and the second superconductive layers 40 and 44. Because the junctions 52 are sealed, no junction edges are susceptible to ion-damage during milling patterning processes. Nor are any junction edges susceptible to contamination and damage from further processing by exposure to solvent and etchant chemicals. Although in the embodiment of the invention shown in FIGS. 7–8 the SQUID 10 has two junctions 52, practitioners in the art recognize that additional junctions can be implemented using multiple laminar structures, each including the superconductor-dielectric-superconductor laminar structure described above, on the same substrate.

As explained above, a wide junction provides superior current flow characteristics. In this embodiment, the width of a junction is defined as the perimeter of the corresponding hole 46 in the dielectric layer 42. The perimeter of a hole can be measured at the location where the hole meets the first superconductive layer 40 or higher above. For the rectangular geometry of the holes in FIG. 8, the width 54 of each rectangle 58 is at most about 1 micron and the length of each rectangle 56 can be about 1 to about 2 microns. To minimize field threading, for each rectangle 58, the width 54 is less than the length 56. Although the dielectric holes 46 shown in FIG. 8 are rectangular, other closed form geometries, such as circular, are equally suitable. As shown in FIG. 7, the perimeter of each hole 46 at the bottom 60 of the hole proximate the first superconductive layer 40 is at most equal to the perimeter of the hole at the top 62 of the hole as prescribed by the angle $\theta$ of the hole walls with respect to the plane of the substrate.

Each hole 46 can also be of different size and geometry compared to the other holes in the SQUID. For example one hole can be rectangular in geometry while another hole can be substantially round and have a different perimeter than the rectangular hole.

The dielectric layer between a pair of hole defines a SQUID hole 64 substantially perpendicular to the plane of the substrate. Because of the sandwich structure, the SQUID of the present invention has significantly lower SQUID loop inductance. A magnetic field applied to the SQUID hole 64 substantially parallel to the plane of the substrate provides for modulation of a critical current (IcT) flowing through the junctions 52 while minimizing SQUID loop inductance.

The SQUID can further comprise an inductor 34 disposed proximate the laminar structure, wherein a magnetic field generated by the inductor 34 by a control current (I) flowing through the inductor 34 is substantially parallel to the plane of the substrate. The magnitude of the control current is proportional to the strength of the magnetic field utilized in modulating a critical current flowing through the SQUID junctions 52. A control line 36 is utilized to route current to the inductor 34. The control line 36 can be of the type described above. The control line 36 can also comprise a superconductive layer or an in-line control line deposited on the second superconductive layer.

The SQUID 10 can further comprise a first passivation layer deposited on the first superconductive layer 40, wherein the dielectric layer 42 is deposited on the passivation layer. The SQUID 10 can also include a second passivation layer deposited on the second superconductive layer 44. The thickness and suitable materials for the passivation layers, the superconductive layers, and the dielectric layer can be selected as described above.

An example method of fabricating the SQUID of the present invention is now described. Deposit and pattern via ion-milling or RIE a first superconductive layer over a substrate. A first passivation layer can be deposited in situ over the first superconductive layer. Deposit and pattern via ion-milling or RIE a dielectric layer described above on the first superconductive layer. Etch off holes in the dielectric layer and the first passivation layer (contact area) to define perimeter of step-edge junctions. Deposit and pattern a second superconductive layer over the dielectric layer via laser ablation or sputtering. The substrate can be rotated or oriented during deposition of the second superconductive layer to control the thickness of the second superconductive layer on the dielectric layer and over the side walls of the dielectric layer. A passivation layer of dielectric can be deposited in situ over the second superconductive layer. The step-edge junctions are formed on the contact area where the second superconductive layer crosses over the hole walls or steps in the dielectric layer to meet the first superconductive layer.

Practitioners in the art recognize that the laminar structures in the embodiments of the SQUID of the present invention described above are not limited to step-edge junctions. The step-edge junctions can be replaced by Superconductor-Normal Conductor-Superconductor (SNS) and other types of junctions.

The present invention has been described in considerable detail with reference to certain preferred versions thereof; however, other versions are possible. Therefore, the spirit and scope of the appended claims should not be limited to the description of the preferred versions contained herein.

What is claimed is:

1. A SQUID with multiple step-edge line junctions, each junction allowing a critical current to flow therethrough minimizing SQUID loop inductance, the SQUID comprising a laminar structure including:
   (a) a substantially planar substrate;
   (b) a first high temperature superconductive layer of substantially uniform thickness deposited on the substrate;
   (c) a dielectric layer deposited on the superconductive layer; the dielectric layer comprising: (i) a planar level segment having opposing ends, and (ii) two planar ramp segments, the ramp segments being connected to the level segment at the opposing ends of the level segment and at opposite angles thereto, and descending from the planar level segment at an angle in the range of thirty degrees to sixty degrees each ramp segment and a corresponding portion of the first superconductive layer to which the ramp segment is directly connected defining a SQUID junction;
   (d) a second high temperature superconductive layer of substantially uniform thickness deposited on the dielectric layer, the second high temperature superconductive layer overlying the dielectric layer with the dielectric layer sandwiched between the first and the second superconductive layers, said second superconductive layer deposited on the planar level segment and the descending ramp segments forming step-edge line junctions at the point where the second superconductor meets the intersection of the planar segment with the descending ramp segments, said step-edge line junctions having a depth equal to the thickness of said second high temperature superconductive layer; and
   (e) means for modulating the critical current comprising:
      the dielectric layer sandwiched between the first and second superconductive layers defining a SQUID hole substantially perpendicular to the substrate;
      thereby minimizing SQUID loop inductance in response to the magnetic field applied to the SQUID hole, the magnetic field applied substantially parallel to the substrate.

2. The SQUID of claim 1 wherein each junction has a width from about 0.1 microns to about 0.9 microns.

3. The SQUID of claim 1 wherein the width of each junction is from about 1.1 microns to about 10 microns.

4. The SQUID of claim 1 further comprising an inductor disposed proximate the laminar structure, wherein a magnetic field generated by the inductor by a control current flowing through the inductor is substantially parallel to the plane of the substrate and substantially parallel to the plane of the ramp segments.

5. The SQUID of claim 1 further comprising a passivation layer deposited on the first superconductive layer, wherein the dielectric layer is deposited on the passivation layer.

6. The SQUID of claim 1 further comprising a passivation layer deposited on the second superconductive layer.

7. The SQUID of claim 6 wherein the passivation layer is a dielectric selected from the group consisting essentially of perovskite structures.

* * * * *